US005640110A

United States Patent [19]

Niratsuka et al.

[11] Patent Number: 5,640,110

[45] Date of Patent: Jun. 17, 1997

[54] CURRENT SUPPLY CIRCUIT

[76] Inventors: Kimitoshi Niratsuka; Yosiaki Sano, both of c/o Fujitsu Limited, 1015, Kamikodanaka, Nakahara-ku, Kawasaki-shi, Kanagawa 211, Japan

[21] Appl. No.: 539,370

[22] Filed: Oct. 5, 1995

Related U.S. Application Data

[63] Continuation of Ser. No. 301,917, Sep. 7, 1994, abandoned.

[30] Foreign Application Priority Data

Sep. 10, 1993 [JP] Japan .................................... 5-226225

[51] Int. Cl.$^{6}$ ............................ H03B 1/00; H03K 17/60; G05F 3/16; H03F 3/04

[52] U.S. Cl. .......................... 327/108; 327/484; 323/315; 330/288

[58] Field of Search .................................... 327/108, 482, 327/484, 490, 530, 535, 538, 560; 323/312, 315, 316; 330/288

[56] References Cited

U.S. PATENT DOCUMENTS

| | | | |
|---|---|---|---|
| 4,801,892 | 1/1989 | Yamakoshi et al. | 330/288 |
| 5,311,146 | 5/1994 | Brannon et al. | 330/288 |
| 5,339,020 | 8/1994 | Siligoni et al. | 323/315 |

FOREIGN PATENT DOCUMENTS

| | | | |
|---|---|---|---|
| 0251215 | 11/1986 | Japan | 330/288 |

*Primary Examiner*—David C. Nelms
*Assistant Examiner*—Trong Phan

[57] ABSTRACT

A current supply circuit includes a current source producing a first current, a current amplifying circuit for producing a second current having a magnitude $a \cdot I/h_{FE}$ from the first current where a is a constant, I is a magnitude of the first current and $h_{FE}$ is a current transfer ratio of a current supply circuit. The above current supply circuit produces a third current from the second current so that the third current has a magnitude equal to a·I.

17 Claims, 7 Drawing Sheets

CURRENT SUPPLY CIRCUIT

This application is a continuation of application Ser. No. 08/301,917 filed Sept. 7, 1994, now abandoned.

BACKGROUND OF THE INVENTION

1. Field of the Invention

The present invention generally relates to current supply circuits, and more particularly to a current supply circuit used as, for example, a bias current supply circuit of an amplifier circuit such as a bipolar integrated circuit amplifier.

It is known that, generally, bipolar transistors have a current transfer ratio which greatly depends on the junction area and the impurity density. When integrally forming a circuit formed of bipolar transistors on a chip, different current transfer ratios are obtained for different wafers due to various errors introduced in the production steps, and hence the circuits formed on the different wafers have different characteristics.

2. Description of the Prior Art

FIG. 1 is a circuit diagram of a conventional constant-current circuit, which is made up of a constant-current source 101, an NPN transistor Q25 used to supply a constant current, and a load resistor $R_L$. A constant voltage Vcc is applied to the constant-current source 101, which produces a constant current I based on the constant voltage Vcc. The current I is supplied to the base of the constant-current supply transistor Q25.

The emitter of the NPN transistor Q25 is grounded, and the collector thereof is coupled to the power supply line of the constant voltage Vcc via the load resistor $R_L$. The collector current $I_C$ is expressed as follows:

$$I_C=h_{FE}I_B \quad (1)$$

where $I_B$ denotes the base current of the NPN transistor Q25, and $h_{FE}$ denotes the current transfer ratio thereof. Hence, the current $I_L$ flowing in the load resistor $R_L$ is written as follows:

$$I_L=h_{FE}I_B \quad (2).$$

In the above conventional constant-current circuit, the load current $I_L$ depends on the current transfer ratio $h_{FE}$ of the NPN transistor Q25. Hence, the load current $I_L$ varies in accordance with a variation in the current transfer ratio $h_{FE}$.

Generally, the junction area and the impurity density slightly vary during the process of producing transistors and ICs. Hence, the transistors formed on different wafers or chips have different current transfer ratios. The different current transfer ratios vary the load transistors $I_L$. As a result, circuit devices equipped with constant-current circuits as described above have different operation characteristics due to deviations in the load current $I_L$.

SUMMARY OF THE INVENTION

It is a general object of the present invention to provide a constant-current circuit in which the above-described disadvantages are eliminated.

A more specific object of the present invention is to provide a constant-current circuit capable of supplying the target constant-current independent of a deviation in the current transfer ratio of a transistor of the constant-current circuit.

These objects of the present invention are achieved by a current supply circuit comprising:

a current source producing a first current;

current amplifying means for producing a second current having a magnitude $a \cdot I/h_{FE}$ from the first current where a is a constant, I is a magnitude of the first current and $h_{FE}$ is a current transfer ratio of a current supply means; and the above current supply means for producing a third current from the second current so that the third current has a magnitude equal to a·I.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
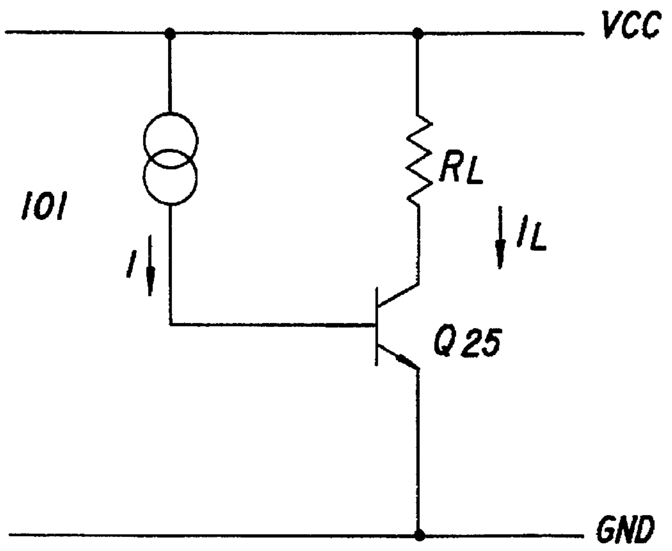
FIG. 1 PRIOR ART
FIG. 1 is a circuit diagram of a conventional constant-current circuit.
Figure 2:
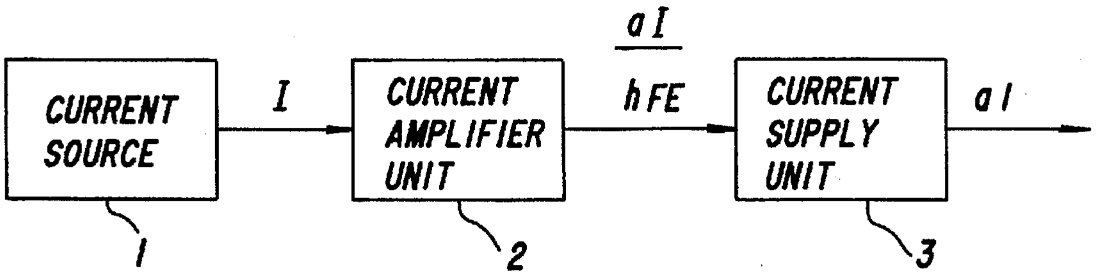
FIG. 2 is a block diagram of the principle of the present invention.

FIG. 2 is a block diagram of the principle of the present invention. The current supply circuit of the present invention includes a current source 1, a current amplifier unit 2 and a current supply unit 3. The constant-current source 1 outputs a current I to the current amplifier unit 2. The current supply unit 3 has a predetermined current transfer ratio $h_{FE}$, and multiplies the input current by $h_{FE}$. The current amplifier unit 2 amplifies the current I from the current source 1 and outputs a current having a magnitude of $(a \cdot I)/h_{FE}$ where a is a constant. The current supply unit 3 amplifies the input current $(a \cdot I)/h_{FE}$ by $h_{FE}$, and outputs the current a·I to a circuit driven by the present current supply circuit. It is to be noted that the output current output by the current supply unit 3 does not depend on the current transfer ratio $h_{FE}$.

Figure 3:
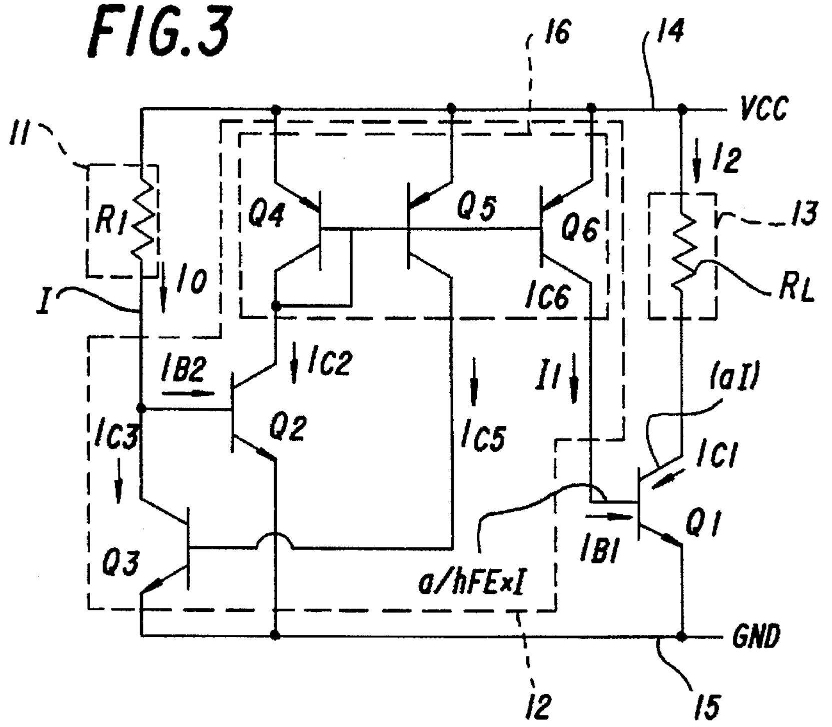
FIG. 3 is a circuit diagram of a first embodiment of the present invention.

FIG. 3 is a circuit diagram of a first embodiment of the present invention. The current supply circuit shown in FIG. 3 includes a current source 11, a current amplifier circuit 12 and a current supply NPN transistor Q1 respectively corresponding to the current source 1, the current amplifier unit 2 and the current supply unit 3 shown in FIG. 2. A load 13 to be supplied with a constant current is connected to the NPN transistor Q1, as shown in FIG. 3.

A constant voltage Vcc of a constant-voltage power supply line 14 is applied to the current source 11, which produces a current $I_0$ from the constant voltage Vcc and supplies it to the current amplifier circuit 12. The current amplifier circuit 12 is connected between the Vcc supply line 14 and a ground line 15, and is driven by the constant voltage Vcc. The current amplifier circuit 12 amplifies the current $I_0$ from the current source 11 and produces a current $I_1$ expressed as follows:

$$I_1=(N/h_{FE1})\cdot I_0 \quad (1\text{-}1)$$

where N is a predetermined constant, and $h_{FE1}$ (equal to (collector current $I_{C1}$)/(base current $I_{B1}$)) is the current transfer ratio of the NPN transistor Q1.

The output current $I_1$ of the current amplifier circuit 12 is supplied to the base of the NPN transistor Q1. The collector of the NPN transistor Q1 is connected to one end of the load 13, and the emitter thereof is grounded.

The NPN transistor Q1 produces the collector current $I_{C1}$ dependent on the base current $I_{B1}$, and a current $I_2$ equal to the collector current $I_C$ flows in the load 13. The collector current $I_{C1}$ can be written as follows:

$$I_{C1}=h_{FE1}\cdot I_{B1} \quad (1\text{-}2).$$

The current $I_1$ (=$(N/h_{FE1})\cdot I_0$) flows in the base of the NPN transistor Q1 from the current amplifier circuit 12. Hence, the collector current $I_{C1}$ of the NPN transistor Q1 expressed in equation (1-2) can be rewritten as follows:

$$\begin{aligned} I_{C1} &= h_{FE1}\cdot I_{B1}=h_{FE1}\cdot I_1 \quad (1\text{-}3)\\ &= h_{FE1}\cdot (N/h_{FE1})\cdot I_0=N\cdot I_0. \end{aligned}$$

The collector current $I_{C1}$ of the NPN transistor Q1 corresponds to the current $I_2$ flowing in the load 13. Hence, a current $I_2$ dependent on the current $I_0$ supplied from the current source 11 flows in the load 13. It can be seen from equation (1-3) that the current $I_2$ flowing in the load 13 is independent of the current transfer ratio $h_{FE1}$ of the NPN transistor Q1.

The current source 11 includes a resistor R1 having one end connected to the Vcc supply line 14, and the other end coupled to the ground line 15 via the base-emitter junction of an NPN transistor Q2 of the current amplifier circuit 12 used to detect the current $I_0$. Hence, the constant voltage Vcc is applied to one end of the resistor R1, and the base-emitter voltage $V_{BE2}$ of the NPN transistor Q2 is applied to the other end of the resistor R1.

Hence, the following voltage is applied across the resistor R1:

$$(Vcc-V_{BE2}) \quad (1\text{-}4)$$

and the current $I_0$ expressed in the following and dependent on the applied voltage ($Vcc-V_{BE2}$) flows to the current amplifier circuit 12:

$$[(Vcc-V_{BE2})/R1] \quad (1\text{-}5).$$

In the above manner, the current $I_0$ flowing in the resistor R1 is supplied to the current amplifier circuit 12.

The current amplifier circuit 12 includes, in addition to the above-mentioned NPN transistor Q2, a control NPN transistor Q3 and a current-mirror circuit 16. The base of the NPN transistor Q2 is connected to the current source 11. The NPN transistor Q2 draws, via its collector, the current $I_{C2}$ dependent on the current $I_0$ from the current source 11, and drives the current-mirror circuit 16.

The current-mirror circuit 16 is made up of PNP transistors Q4–Q6, and outputs a current dependent on the collector current $I_{C2}$ of the NPN transistor Q2 via the collectors of the PNP transistors Q5 and Q6. A ratio of the emitter areas of the PNP transistors Q4, Q5 and Q6 is set equal to 1:(1/N): 1. The currents dependent on the above ratio are output via the collectors of the PNP transistors Q4, Q5 and Q6. The collector of the PNP transistor Q5 of the current-mirror circuit 16 is connected to the base of the NPN transistor Q3, and a current $I_{C3}$ dependent on the collector current of the PNP transistor Q5 is input to the NPN transistor Q3 via its collector. The collector of the NPN transistor Q3 is connected to the NPN transistor Q2, and controls the base current of the NPN transistor Q2.

The collector of the PNP transistor Q6 of the current-mirror circuit 16, which serves as the output terminal of the current amplifier circuit 12, is connected to the base of the NPN transistor Q1. The collector current $I_{C6}$ of the PNP transistor Q6 is supplied to the NPN transistor Q1, as the base current thereof. The NPN transistor Q1 draws the current $I_{C1}$ dependent on the base current $I_{B1}$ of the NPN transistor Q1, and supplies the current $I_2$ to the load 13.

A description will now be given of the operation of the circuit shown in FIG. 3. The following parameters will now be defined:

$I_{C1}$–$I_{C6}$: collector currents of transistors Q1–Q6

$I_{B1}$–$I_{B6}$: base currents of transistors Q1–Q6

$I_{E1}$–$I_{E6}$: emitter currents of transistors Q1–Q6

$V_{BE1}$–$V_{BE6}$: base-emitter voltages of transistors Q1–Q6

$h_{FE1}$–$h_{FE6}$: current transfer ratios of transistors Q1–Q6

Generally, the base-emitter voltage $V_{BE}$ can be expressed as follows:

$$V_{BE}=(kT/q)ln(I_E/I_S) \quad (2\text{-}1)$$

where T is the absolute temperature, k is the Boltzmann constant, q is the electron charge, $I_S$ is the saturation current, and $I_E$ is the emitter current.

Form equation (2-1), the base-emitter voltage $V_{BE4}$ of the transistor Q4 is written as follows:

$$V_{BE4}=(kT/q)ln(I_{E4}/I_{S4}) \quad (2\text{-}2).$$

The base-emitter voltage $V_{BE5}$ of the transistor Q5 is written as follows:

$$V_{BE5}=(kT/q)ln(I_{E5}/I_{S5}) \quad (2\text{-}3).$$

The base-emitter voltage $V_{BE6}$ of the transistor Q6 is written as follows:

$$V_{BE6}=(kT/q)ln(I_{E6}/I_{S6}) \quad (2\text{-}4).$$

The ratio of the emitter areas of the transistors Q4, Q5 and Q6 are set equal to 1:(1/N): 1. Taking into account the above, assuming that $I_{S4}=I_{S6}=I_S$, the equations (2-2), (2-3) and (2-4) can be rewritten as follows:

$$V_{BE4}=(kT/q)ln(I_{E4}/I_S) \quad (2\text{-}5)$$

$$V_{BE5}=(kT/q)ln(I_{E5}/(1/N\cdot I_S)) \quad (2\text{-}6)$$

$$V_{BE6}=(kT/q)ln(I_{E6}/I_S) \quad (2\text{-}7).$$

The bases of the transistors Q4, Q5 and Q6 are connected together, and hence $V_{BE4}=V_{BE5}=V_{BE6}$. Hence, from equations (2-5)–(2-7), the following expression can be obtained:

$$(kT/q)\ln(I_{E4}/I_S)=(kT/q)\ln(N\cdot I_{E5}/I_S)=(kT/q)\ln(I_{E6}/I_S). \quad (2\text{-}8)$$

From equation (2-8), the following is obtained:

$$I_{E4}=N\cdot I_{E5}=I_{E6} \quad (2\text{-}9).$$

Generally, the transistors satisfy the following equation:

$$I_E-I_C=I_B \quad (2\text{-}10)$$

$$I_C=h_{FE}I_B \quad (2\text{-}11)$$

Hence, by inserting equation (2-10) into equation (2-11), the following equation can be obtained:

$$I_C=h_{FE}(I_E-I_C) \quad (2\text{-}12).$$

Thus, the collector current $I_C$ can be rewritten as follows:

$$I_C+h_{FE}\cdot I_C=(1+h_{FE})\ I_C=h_{FE}\cdot I_E \quad (2\text{-}13).$$

Finally, the collector current $I_C$ can be expressed:

$$I_C=(h_{FE}/(1+h_{FE}))I_E \quad (2\text{-}14).$$

From equation (2-14), the collector current $I_{C4}$ of the transistor Q4 is:

$$I_{C4}=(h_{FE4}/(1+h_{FE4}))I_{E4} \quad (2\text{-}15).$$

Similarly, the collector currents $I_{C5}$ and $I_{C6}$ of the transistors Q5 and Q6 are:

$$I_{C5}=(h_{FE5}/(1+h_{FE5}))I_{E5} \quad (2\text{-}16).$$

$$I_{C6}=(h_{FE6}/(1+h_{FE6}))I_{E6} \quad (2\text{-}17).$$

The transistors Q4, Q5 and Q6 are produced by the same production process and have almost the same junction areas and impurity densities. Hence, the following stands:

$$h_{FE4}\approx h_{FE5}\approx h_{FE6}\approx h_{FEP} \quad (2\text{-}18).$$

Taking into account equation (2-18), equations (2-15), (2-16) and (2-17) can be rewritten as follows:

$$I_{C4}=(h_{FEP}/(1+h_{FEP}))I_{E4} \quad (2\text{-}19)$$

$$I_{C5}=(h_{FEP}/(1+h_{FEP}))I_{E5} \quad (2\text{-}20)$$

$$I_{C6}=(h_{FEP}/(1+h_{FEP}))I_{E6} \quad (2\text{-}21).$$

Further, $I_{E4}=N\cdot I_{E5}=I_{E6}$ as defined by equation (2-9), and therefore the following equation can be obtained from equations (2-19) through (2-21)

$$I_{C4}=N\cdot I_{C5}=I_{C6} \quad (2\text{-}22).$$

The collector current $I_{C2}$ of the transistor Q2 is:

$$I_{C2}=I_{C4}+I_{B4}+I_{B5}+I_{B6} \quad (2\text{-}23)$$

and can be rewritten as follows taking into account equation (2-11):

$$I_{C2}=I_{C4}+(I_{C4}/h_{FE4})+(I_{C5}/h_{FE5})+(I_{C6}/h_{FE6}) \quad (2\text{-}24)$$

Taking into account equations (2-18) and (2-22), equation (2-24) can be written as follows:

$$I_{C2}=N\cdot I_{C5}+[(N\cdot I_{C5})/h_{FEP}]+(I_{C5}/h_{FEP})+[(N\cdot I_{C5})/h_{FEP}]= \quad (2\text{-}25)$$
$$N\cdot I_{C5}+[(N\cdot I_{C5}+I_{C5}+N\cdot I_{C5})/h_{FEP}]=$$
$$N\cdot I_{C5}+[(2N+1)I_{C5}]/h_{FEP}=[N+(2N+1)/h_{FEP}]I_{C5}$$

The base current $I_{B2}$ of the transistor Q2 is written as follows from equation (2-13):

$$I_{B2}=I_0-I_{C3}=I_0-h_{FE3}\cdot I_{B3} \quad (2\text{-}26).$$

Here, $I_{B3}=I_{C5}$, and hence equation (2-26) can be rewritten as follows:

$$I_{B2}=I_0-h_{FE3}\cdot I_{C5} \quad (2\text{-}27).$$

The collector current $I_{C2}$ of the transistor Q2 can be expressed as follows:

$$I_{C2}=h_{FE2}\cdot I_{B2} \quad (2\text{-}28).$$

By inserting equations (2-25) and (2-27) into equation (2-28), the following equation can be obtained:

$$[N+(2N+1)/h_{FEP}]I_{C5}=h_{FE2}(I_0-h_{FE3}\cdot I_{C5}) \quad (2\text{-}29).$$

Equation (2-29) can be arranged as follows:

$$h_{FE2}\cdot I_0=[N+(2N+1)/h_{FEP}]I_{C5}+h_{FE3}^2\cdot I_{C5}= \quad (2\text{-}30)$$
$$[N+(2N+1)/h_{FEP}+h_{FE3}^2]I_{C5}.$$

From equation (2-30), the current $I_0$ can be written as follows:

$$I_0=[(1/h_{FE2})(N+(2N+1)/h_{FEP})+h_{FE3}]I_{C5} \quad (2\text{-}31).$$

The transistors Q2 and Q3 are produced by the same production process, and have almost the same junction areas and the impurity densities. Hence, the following stands:

$$h_{FE2}\approx h_{FE3}\approx h_{FEN} \quad (2\text{-}32).$$

By substituting equation (2-32) for equation (2-31), the following is obtained:

$$I_0=[(1/h_{FEN})(N+(2N+1)/h_{FEP})+h_{FEN}]I_{C5} \quad (2\text{-}33).$$

From equation (2-33), the collector current $I_{C5}$ of the transistor Q5 is represented as follows:

$$I_{C5}=1/[(1/h_{FEN})(N+(2N+1)/h_{FEP})+h_{FEN}]\cdot I_0 \quad (2\text{-}34).$$

Normally, $h_{FEN}(\sim 100)$, $h_{FEP}(30\sim 50)>>0$, and thus the following part in equation (2-34) can be set zero as follows:

$$(1/h_{FEN})\ (N+(2N+1)/h_{FEP})\approx 0$$

Hence, equation (2-34) can be rewritten as follows:

$$I_{C5}\approx(1/h_{FEN})I_C \quad (2\text{-}35).$$

The collector current $I_{C6}$ of the transistor Q6 can be written as follows using equation (2-22):

$$I_{C6}=N\cdot I_{C5} \quad (2\text{-}36).$$

Hence, by inserting equation (2-35) into equation (2-36), the collector current $I_{C6}$ can be rewritten as follows:

$$I_{C6}=(N/h_{FEN})I_0 \quad (2\text{-}37).$$

The collector current $I_{C6}$ of the transistor Q6 corresponds to the base current $I_{B1}$ of the transistor Q1. Hence, from equation (2-11), the collector current $I_{C1}$ of the transistor Q1 is represented as:

$$I_{C1}=h_{FE1}\cdot I_{B1}=I_{FE1}\cdot I_{C6} \quad (2\text{-}38)$$

and the following equation stands:

$$h_{FE1}=h_{FEN}$$

because the transistor Q1 is produced by the same production steps for the other NPN transistors and has almost the same junction area and impurity density as those of the other NPN transistors.

Hence, equation (2-36) can be changed as follows:

$$I_{C1}=h_{FEN}\cdot I_{C6} \quad (2\text{-}39).$$

By inserting equation (2-38) into equation (2-39), the following equation can be obtained:

$$I_{C1}=I_2=h_{FEN}(N\cdot I_0/h_{FEN})=N\cdot I_0 \quad (2\text{-}40).$$

The collector current $I_{Cl}$ of the transistor Q1 corresponds to the current supplied to the load 13, and does not depend on the current transfer ratios $h_{FEP}$ and $h_{FEN}$ of the transistors Q1–Q6.

As described above, according to the first embodiment of the present invention, it is possible to supply the load 13 with the current independent of the current transfer ratios of the transistors used in the circuit. Hence, the current supplied to the load 13 is immune to the influence of the current transfer ratios $h_{FE}$ and is always constant even when the current transfer ratios $h_{FE}$ of the transistors forming the circuit have deviations from the target values due to errors in the junction areas and impurity densities.

The circuit driving voltage Vcc depends on the base-emitter voltage $V_{BE1}$ of the transistor Q1 and the collector-emitter voltage $V_{CE6}$ of the transistor Q6, or depends on the base-emitter voltage $V_{BE3}$ of the transistor Q3 and the collector-emitter voltage $V_{CE5}$ of the transistor Q5, as shown below:

$$VCC=V_{BE1}+V_{CE6} \text{ or } Vcc=V_{BE3}+V_{CE5}.$$

Normally, the base-emitter voltage $V_{BE}$ of the transistors is approximately 0.7 [V], and the collector-emitter voltage $V_{CE}$ thereof is approximately 0.1 [V]. Hence, the driving voltage Vcc is required to have the following minimum voltage:

$$Vcc=0.7+0.1=0.8 \text{ [V]}.$$

It is to be noted that the circuit can be driven by a voltage as low as 0.8 [V].

Figure 4:
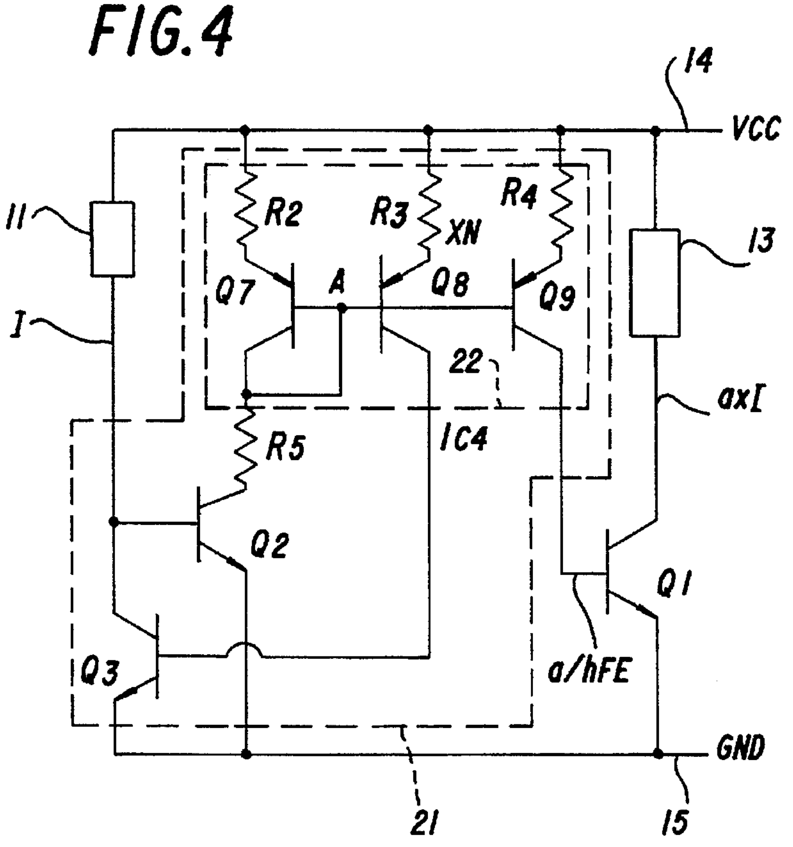
FIG. 4 is a circuit diagram of a second embodiment of the present invention.

FIG. 4 is a circuit diagram of a second embodiment of the present invention. In FIG. 4, parts that are the same as those shown in FIG. 3 are given the same reference numbers, and a description thereof will be omitted here.

The second embodiment of the present invention differs from the first embodiment thereof in the configuration of a current amplifier circuit 21, more particularly, the method of setting the current ratio in a current-mirror circuit 22.

The current mirror circuit used in the second embodiment of the present invention is made up of 10 resistors R2, R3 and R4, and PNP transistors Q7, Q8 and Q9. The PNP transistors Q7, Q8 and Q9 have the same junction areas and characteristics as each other. The resistors R2, R3 and R4 are respectively connected between the emitters of the PNP transistors Q7, Q8 and Q9 and the Vcc supply line 14, and are used to control the emitter currents $I_{E7}$, $I_{E8}$ and $I_{E9}$. By setting the ratio of the resistors R2, R3 and R4 to be 1: N:1, the ratio of the emitter currents $I_{E7}$, $I_{E8}$ and $I_{E9}$ of the PNP transistors Q7, Q8 and Q9 can be set to be 1: (1/N):1.

According to the second embodiment of the present invention, it is possible to control the ratio of the emitter currents of the transistors Q7, Q8 and Q9 by changing the ratio of the resistors R2, R3 and R4 and to thereby control the magnitude of the output current. Hence, it is possible to easily set the current within a wide range, as compared with the first embodiment of the present invention.

The resistors R2, R3 and R4 used in the second embodiment of the present invention decrease the base potential of the PNP transistors Q7, Q8 and Q9. If the base potentials of the PNP transistors Q7, Q8 and Q9 are excessively low, these transistors may not operate. With the above in mind, a resistor R5 is provided between the collector of the transistor Q2 and the collector of the transistor Q7 in order to prevent a drop of the PNP transistors Q7, Q8 and Q9 of the current-mirror circuit 22. With use of the resistor R5, it becomes possible to ensure the normal operation of the circuit.

Figure 5:
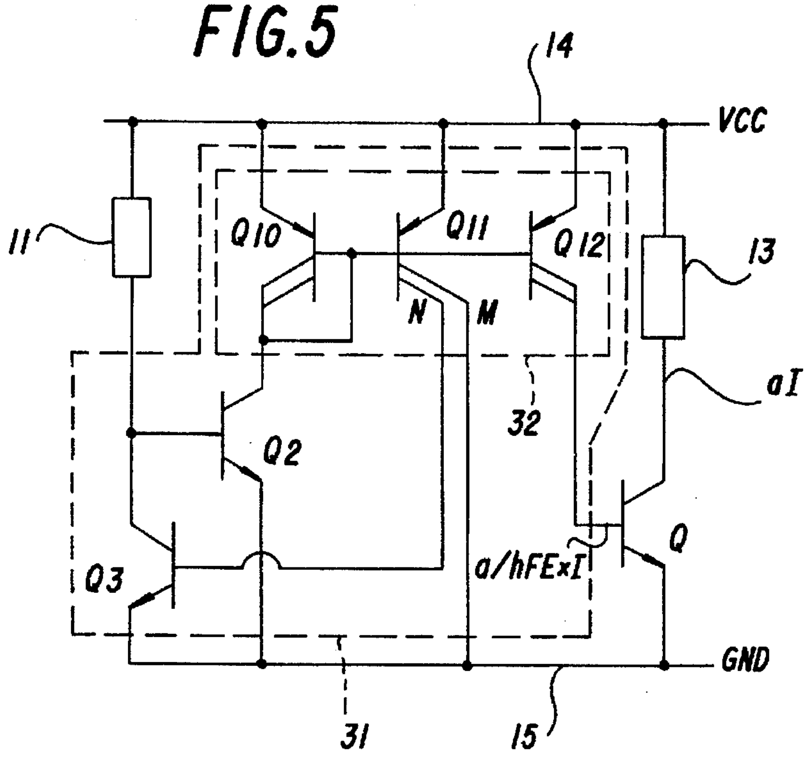
FIG. 5 is a circuit diagram of a third embodiment of the present invention.

FIG. 5 is a circuit diagram of a third embodiment of the present invention. In FIG. 5, parts that are the same as those shown in FIG. 3 are given the same reference numbers, and a description thereof will be omitted here.

The third embodiment of the present invention differs from the first embodiment thereof in the configuration of a current-mirror circuit 32 forming the current amplifier circuit 31. The current-mirror circuit 32 used in the third embodiment of the present invention is formed of multi-collector PNP transistors Q10–Q12 in order to facilitate the setting of the ratio of the currents flowing in the current-mirror circuit 32.

Figure 6:
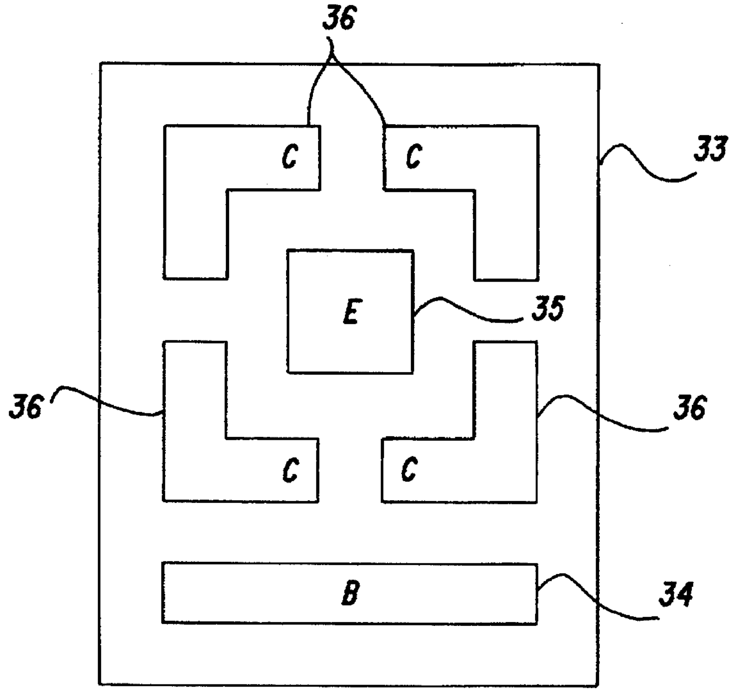
FIG. 6 is a plan view of a multi-collector transistor used in the third embodiment of the present invention.

FIG. 6 is a plan view of the multi-collector PNP transistors Q10–Q12. On an isolation area 33 on which the transistors Q10–Q12 are formed, there are defined a base area 34, an emitter area 35 and a plurality of collector areas 36.

All the collector areas 36 of each of the transistors Q10 and Q12 are used, while a necessary number of collector areas among the collector areas 36 of the transistor Q11 is connected to the base of the NPN transistor Q3, and the remaining collector area or areas 36 are connected to the ground line 15.

In the structure shown in FIG. 6, each of the transistors Q10–Q12 has four collector areas 36, and the transistor Q11 can produce the collector current equal to, for example, ¼, ½ or ¾ of the collector currents of the transistors Q10 and Q12.

Figure 7:
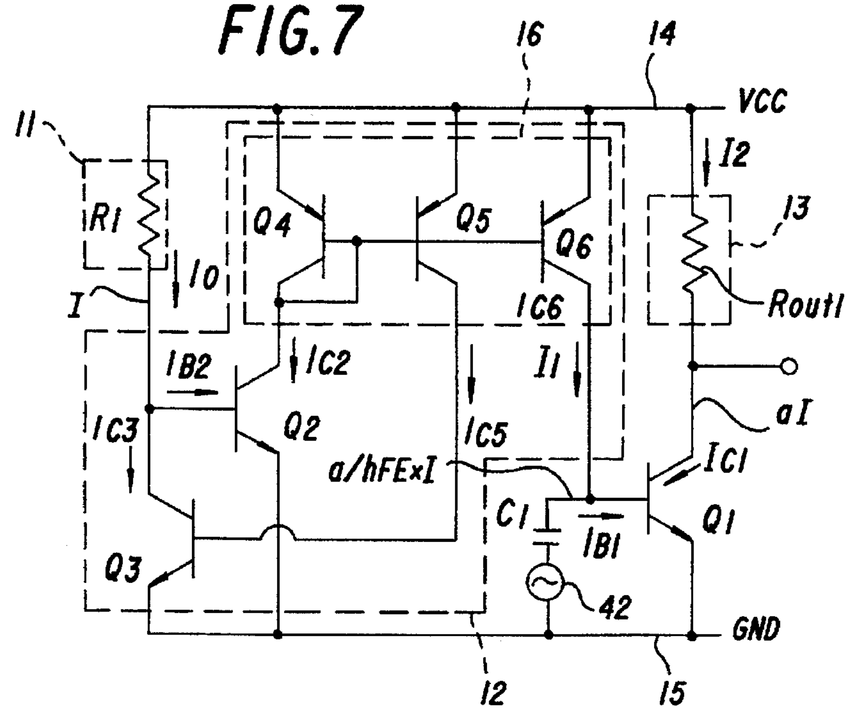
FIG. 7 is a circuit diagram of a fourth embodiment of the present invention.

FIG. 7 is a circuit diagram of a fourth embodiment of the present invention. In FIG. 7, parts that are the same as those shown in FIG. 3 are given the same reference numbers, and a description thereof be omitted here.

The fourth embodiment of the present invention is an application of the circuit shown in FIG. 3 to an amplifier circuit. The current supply transistor Q1 is used as a transistor for supplying a bias current and amplifying a signal. The base of the transistor Q1 is connected to the current amplifier circuit 12, and is supplied with the bias current equal to $(N/h_{FE})I_0$. A signal source 42 is coupled to the base of the transistor Q1 via a capacitor C1 for cutting off the DC component.

The emitter of the transistor Q1 is grounded, and the collector thereof is coupled to the Vcc supply line 14 via an output resistor Rout1. The amplified signal is output via a connection node at which the output resistor Rout1 and the collector of the transistor Q1 are connected together.

The signal from the signal source 42 is supplied to the base of the transistor Q1 together with the bias current from the current amplifier circuit 12. The transistor Q1 draws the collector current dependent on the supplied bias current and the signal, and outputs a signal biased at a predetermined level by the bias current.

Figure 8:
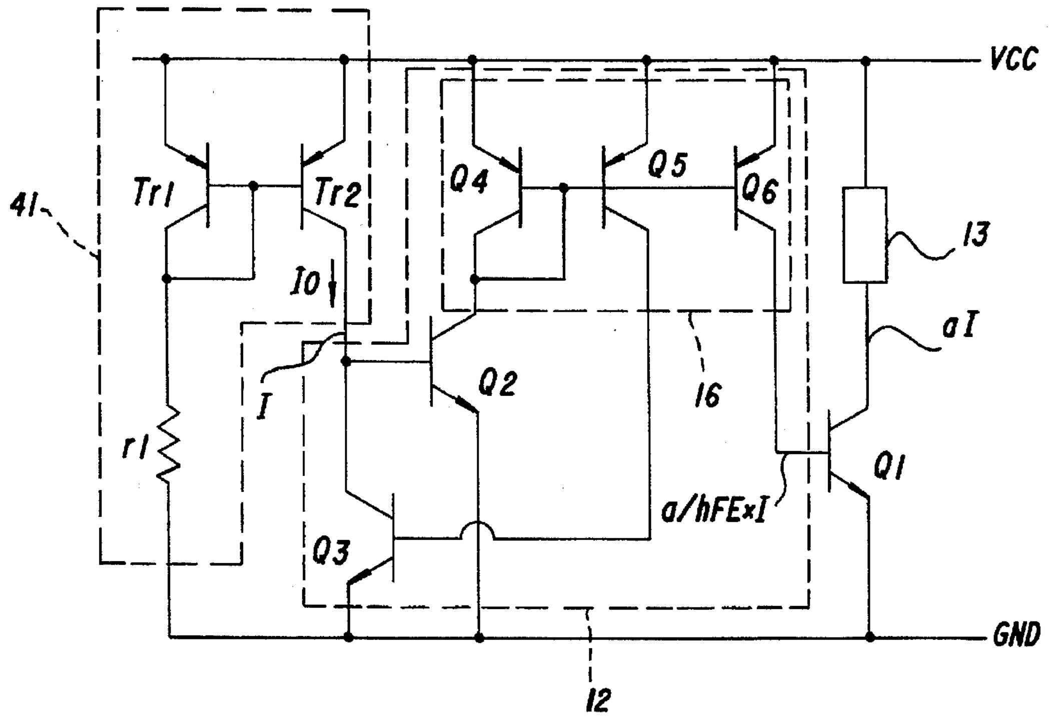
FIG. 8 is a circuit diagram of a fifth embodiment of the present invention.

FIG. 8 is a circuit diagram of a fifth embodiment of the present invention. In FIG. 8, parts that are the same as those shown in FIG. 3 are given the same reference numbers.

The fifth embodiment of the present invention differs from the first embodiment thereof in that a current source 41 used in the fifth embodiment differs from the current source 11 used in the first embodiment. The current source 41 includes a current-mirror circuit made up of PNP transistors Tr1, Tr2 and a resistor r1. The constant current $I_0$ is determined by the resistor r1 and the current transfer ratios of the PNP transistors Tr1 and Tr2. With the above circuit configuration, it is possible to supply the constant current more accurately than the current source formed with the resistor R1 only.

It will be noted that the constant-current source 41 used in the fifth embodiment of the present invention can be applied to the second through fourth embodiments thereof because the structure of the constant-current source 41 itself is independent of the structure of the current amplifier circuit 12.

In the current amplifier circuits 12, 21 and 31 used in the first through fifth embodiments of the present invention, the collector current ratios of the sets of PNP transistors Q4–Q6, Q7–Q9 and Q10–Q12 forming the current-mirror circuits 16, 22 and 32 are set equal to 1:1/N:1, respectively. By changing the emitter area ratios of the PNP transistors Q4–Q6, the resistance ratios of the resistors R2–R4, or the number of collectors of the transistors Q10–Q12 to be connected, it is possible to set the collector current ratios of the sets of transistors Q4–Q6, Q7–Q9 and Q10–Q12 equal to 1:(1/N):M. In this case, the collector currents $I_{C4}$, $I_{C7}$ and $I_{10}$ of PNP transistors Q4, Q7 and Q10 are equal to $I_{C6}$/M, $I_{C9}$/M and $I_{C12}$/M, respectively, and the collector currents $I_{C5}$, $I_{C8}$ and $I_{C11}$ of the PNP transistors Q5, Q8 and Q11 are equal to $I_{C6}$/NM, $I_{C9}$/NM and $I_{C12}$/NM. Hence, the currents can be reduced and therefore the power consumption can be reduced.

Figure 9:
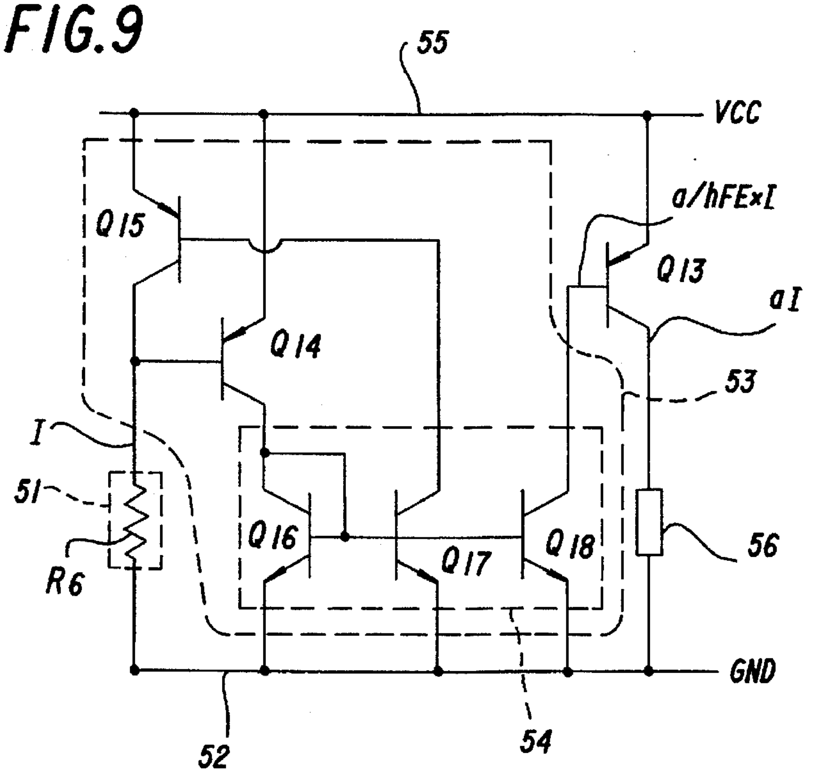
FIG. 9 is a circuit diagram of a sixth embodiment of the present invention.

FIG. 9 is a circuit diagram of a sixth embodiment of the present invention. In FIG. 9, parts that are the same as those shown in FIG. 3 are given the same reference numbers, and a description thereof will be omitted here. The sixth embodiment of the present invention uses transistors Q13–Q18 having the polarities opposite to those of the transistors Q1–Q6 used in the configuration shown in FIG. 3.

A current source 51 corresponds to the current source 1, and is provided between a ground line 52 and a current amplifier circuit 53. The current source 51 supplies the current amplifier circuit 53 with a current. The current amplifier circuit 53 is made up of a current detection PNP transistor Q14, a control PNP transistor Q15 and a current-mirror circuit 54.

The current source 51, which is formed with a resistor R6, has one end connected to the ground line 52 and the other end connected to the base of the transistor Q14 of the current amplifier circuit 53. The emitter of the transistor Q14 is connected to a constant-voltage (Vcc) supply line 55. A voltage equal to Vcc–$V_{BE14}$ is applied to the current source 51 where $V_{BE14}$ is the base-emitter voltage of the transistor Q14. A current (Vcc–$V_{BE14}$)/R6 flows in the resistor R6 of the current source 51.

The current-mirror circuit 54 is made up of NPN transistors Q16–Q18, and the currents dependent on the collector current $I_{C14}$ of the PNP transistor Q14 are supplied as the collector currents $I_{C17}$ and $I_{C18}$ of the NPN transistors Q17 and Q18. The ratio of the emitter areas of the NPN transistors Q16–Q18 is equal to 1:(1/N):1, and the collector current $I_{C17}$ of the transistor Q17 is equal to 1/N of the collector current $I_{C18}$.

The collector of the NPN transistor Q17 is connected to the base of the control transistor Q15. The emitter of the transistor Q15 is connected to the Vcc supply line 55, and the collector thereof is connected to the base of the transistor Q14. The collector current $I_{C15}$ of the collector current $I_{C15}$ is controlled by the collector current $I_{C17}$ of the NPN transistor Q17, and controls the transistor Q14.

The collector of the transistor Q18 is connected to the base of the PNP transistor Q13, which has the emitter connected to the Vcc line 55 and the collector connected to a load 56. The transistor Q13 supplies the load 56 with the collector current $I_{C13}$dependent on the collector current of the transistor Q18.

The sixth embodiment of the present invention is made up of the transistors having the polarities opposite to those of the transistors Q1–Q8, and therefore the aforementioned equations (1-1) to (1-3) and (2-1) to (2-40) can be applied to the sixth embodiment of the present invention independent of the polarities of the transistors. Hence, the sixth embodiment of the present invention has the same advantages as those of the first embodiment thereof.

The sixth embodiment of the present invention can be applied to a load connected to the ground line.

Figure 10:
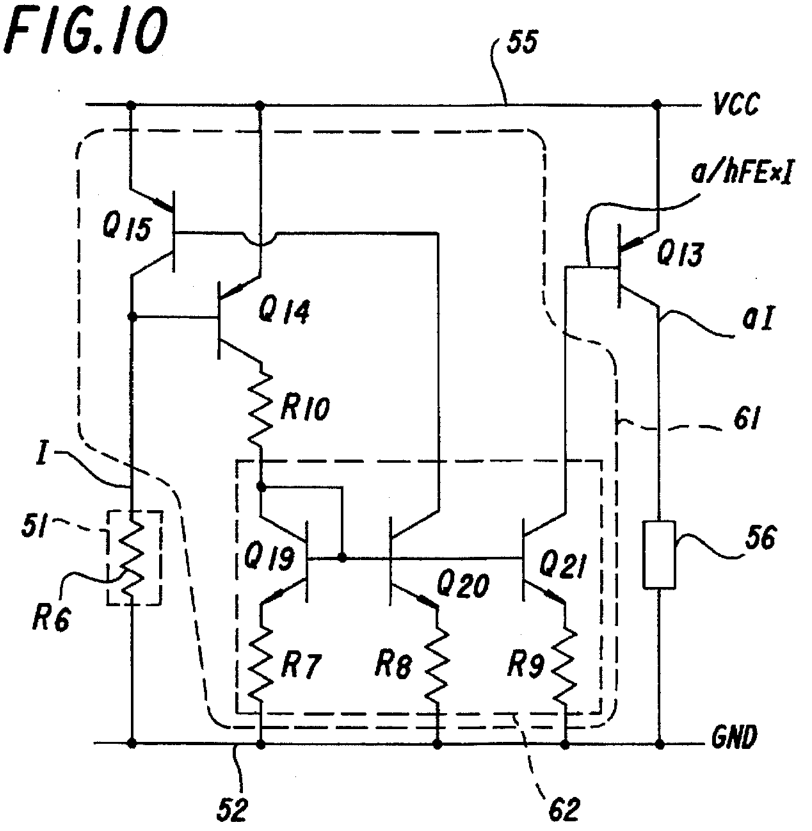
FIG. 10 is a circuit diagram of a seventh embodiment of the present invention.

FIG. 10 is a circuit diagram of a seventh embodiment of the present invention. In FIG. 10, parts that are the same as those shown in FIG. 9 are given the same reference numbers, and a description thereof will be omitted here. The seventh embodiment of the present invention has a current-mirror circuit different from that of the sixth embodiment of the present invention. More particularly, the setting method for selecting the ratio of the currents flowing in the current-mirror circuit used in the seventh embodiment of the present invention is different from that of the sixth embodiment thereof.

A current-mirror circuit shown in FIG. 10 is made up of resistors R7, R8 and R9, and NPN transistors Q19, Q20 and Q21, which have the same emitter areas to have the same performance.

The resistors R7, R8 and R9 are respectively connected between the emitters of the NPN transistors Q19, Q20 and Q21 and the ground line 52, and control the emitter currents $I_{E19}$, $I_{E20}$ and $I_{E21}$. By setting the ratios of the resistors R7, R8 and R9 equal to 1: N:1, the ratio of the emitter currents $I_{E19}$, $I_{E20}$ and $I_{E21}$ of the NPN transistors Q19, Q20 and Q21 is equal to 1:(1/N)

According to the seventh embodiment of the present invention, it is easy to perform the setting of the output current with a large degree of freedom, as compared with the sixth embodiment of the present invention.

In the seventh embodiment of the present invention, the base potentials of the NPN transistors Q19, Q20 and Q21 become high due to the resistors R7, R8 and R9. If the base potentials of the transistors Q19, Q20 and Q21 become high excessively, these transistors do not operate. With the above in mind, a resistor R10 is provided between the collector of the transistor Q14 and the current-mirror circuit 62. The resistor R10 functions to prevent excessive increases in the base potentials of the transistors Q19, Q20 and Q21. Hence, it is possible to improve the reliability of the circuit operation.

Figure 11:
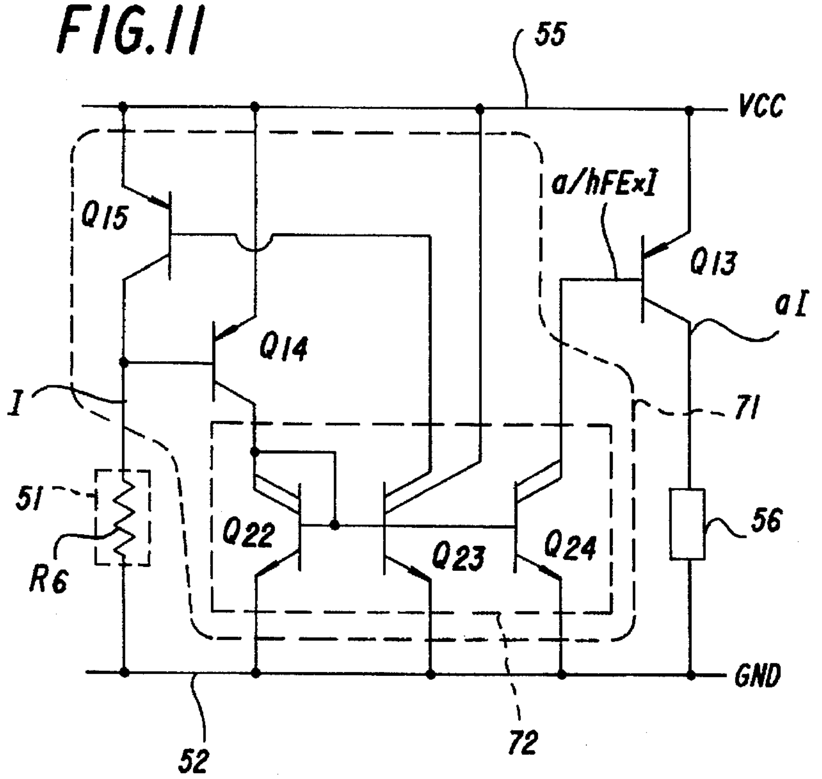
FIG. 11 is a circuit diagram of an eighth embodiment of the present invention.

FIG. 11 is a circuit diagram of an eighth embodiment of the present invention. In FIG. 11, parts that are the same as those shown in FIG. 9 are given the same reference numbers, and a description thereof will be omitted here. A current-mirror circuit 72 forming a current amplifier circuit 71 shown in FIG. 11 differs from that used in the sixth embodiment of the present invention. The current-mirror circuit 72 is made up of multi-collector NPN transistors Q22–Q24, which facilitate the setting operation on the ratio of the currents flowing in the current-mirror circuit 72.

The multi-collector NPN transistors Q22–Q24 are formed so that the base area 34, the emitter area 35 and a plurality of collector areas 36 are formed on the isolation area 33, as shown in FIG. 6. In the eighth embodiment of the present invention being considered, all the collector areas 36 of each of the transistors Q22 and Q24 are used. A number of collectors among the collectors of the transistor Q23 dependent on the target current ratio is connected to the base of the PNP transistor Q15, and the remaining collector or collectors of the transistor Q23 are connected to the Vcc supply line 55.

In the structure shown in FIG. 6, each of the transistors Q22–Q24 includes four collector areas 36, and the transistor Q23 supplies, for example, a current equal to ¼, ½ or ¾ of the collector currents of the transistors Q22 and Q24.

Figure 12:
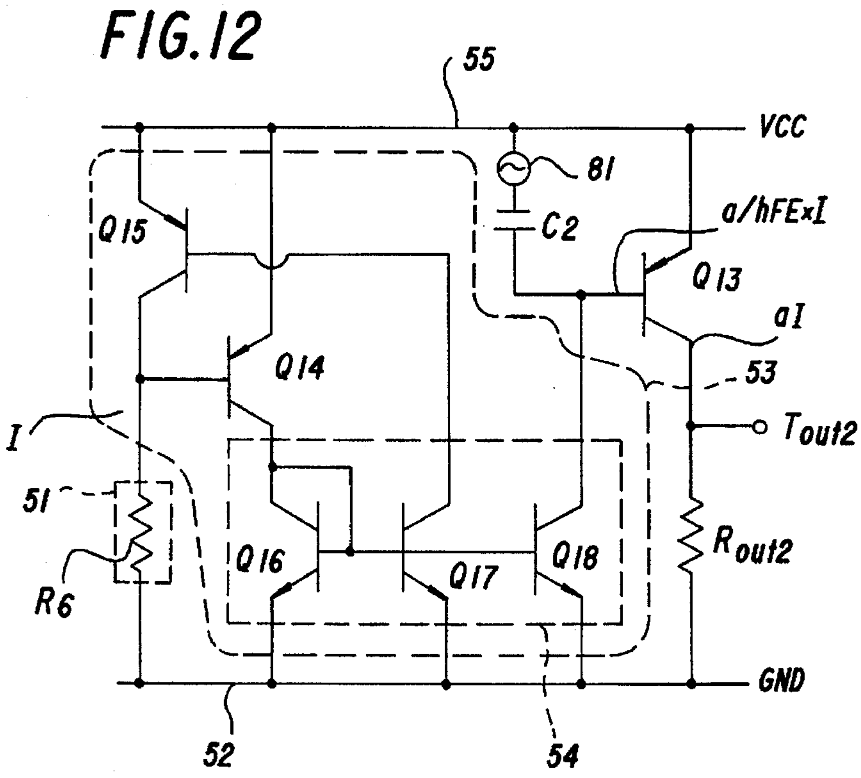
FIG. 12 is a circuit diagram of a ninth embodiment of the present invention.

FIG. 12 is a circuit diagram of a ninth embodiment of the present invention. In FIG. 12, parts that are the same as those shown in FIG. 9 are given the same reference numbers, and a description thereof will be omitted here.

In the ninth embodiment of the present invention, the circuit shown in FIG. 9 is applied to an amplifier circuit. The transistor Q13 is used to supply a bias current and amplify a signal generated by a signal source 81. The base of the transistor Q13 is connected to the current amplifier circuit 53, and is supplied with the bias current equal to $(N/h_{FE})I_0$. The signal source 81 is coupled to the base of the transistor Q13 via a capacitor C2, which functions to cut off the DC component. The emitter of the transistor Q13 is connected to the Vcc supply line 55, and the collector thereof is coupled to the ground line 52 via an output resistor Rout2. The amplified signal is output via a node at which the output resistor Rout2 and the collector of the transistor Q13 are connected together.

The signal supplied from the signal source 81 is supplied to the base of the transistor Q13 together with the bias current from the current amplifier circuit 53. The transistor Q13 changes the collector current on the basis of the bias current and the signal from the signal source 81, and outputs the amplified signal biased to a predetermined level by the bias current to the output terminal Tout2.

Figure 13:
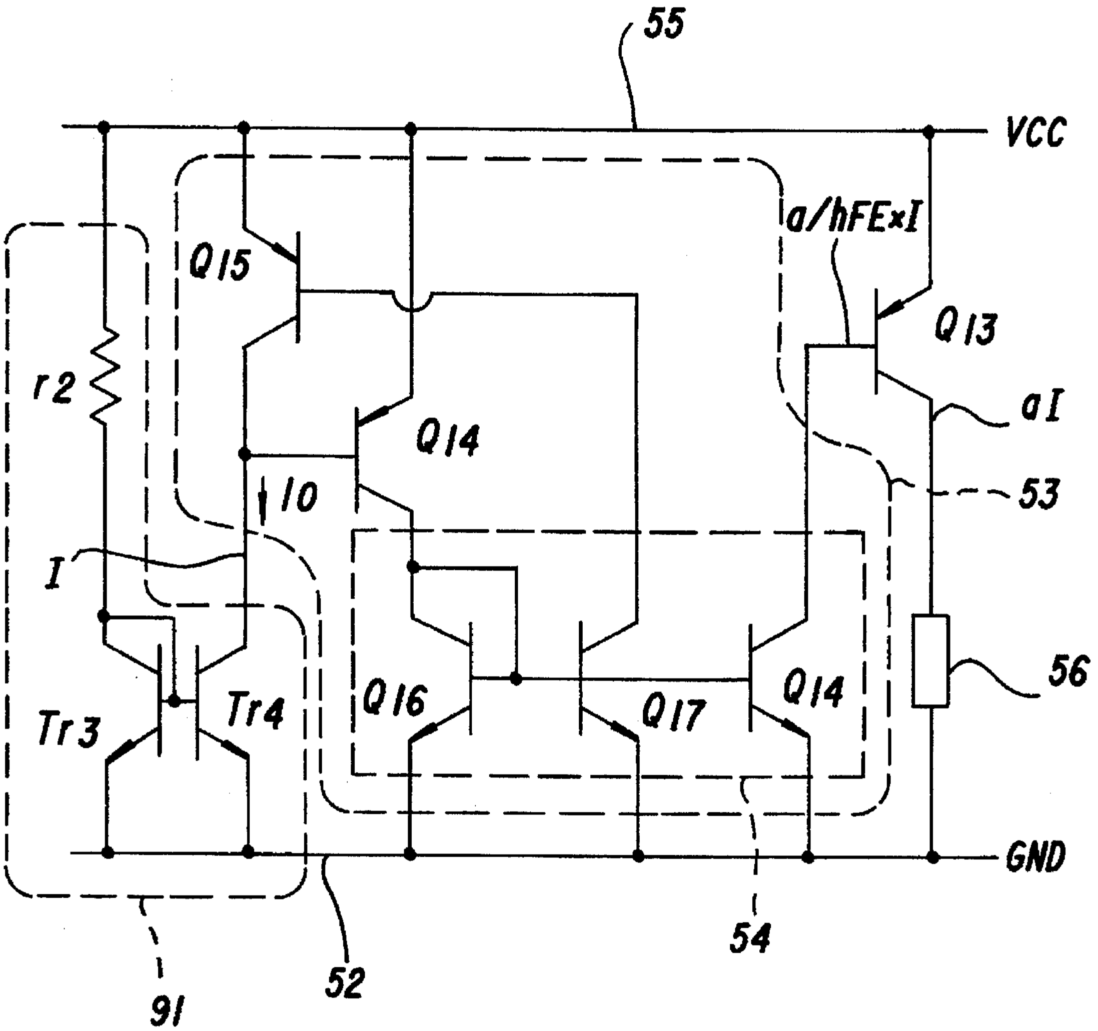
FIG. 13 is a circuit diagram of a tenth embodiment of the present invention.

FIG. 13 is a circuit diagram of a tenth embodiment of the present invention. In FIG. 13, parts that are the same as those shown in FIG. 7 are given the same reference numbers, and a description thereof will be omitted here. The tenth embodiment of the present invention has a current source different from that used in the sixth embodiment thereof. A current source 91 shown in FIG. 13 includes a current-mirror circuit made up of NPN transistors Tr3 and Tr4 and a resistor r2, and supplies the current amplifier circuit 53 with the constant current $I_0$ determined by the resistor r2 and the current transfer ratio of the transistors Tr3 and Tr4. According to the tenth embodiment of the present invention, it is possible to provide the constant current more accurately than the current source having the resistor R6 only.

The constant-current source 91 used in the tenth embodiment of the present invention can be applied to the sixth to ninth embodiments of the present invention because the constant-current source 91 is independent of the current amplifier circuit 12.

In the current amplifier circuits 53, 61 and 71 used in the sixth through tenth embodiments of the present invention, the collector current ratios of the sets of NPN transistors Q16–Q18, Q19–Q21 and Q22–Q24 forming the current-mirror circuits 54, 62 and 72 are set equal to 1:1/N:1, respectively. By changing the emitter area ratios of the transistors, the resistance ratios of the resistors, or the number of collectors of the transistors to be connected, it is possible to set the collector current ratios of the sets of transistors Q16–Q18, Q19–Q21 and Q22–Q24 equal to 1:(1/N):M. In this case, the collector currents $I_{C16}$, $I_{C19}$ and $I_{22}$ of the transistors Q16, Q19 and Q22 are equal to $I_{C18}/M$, $I_{C21}/M$ and $I_{C23}/M$, respectively, and the collector currents $I_{C17}$, $I_{C20}$ and $I_{C23}$ of the transistors Q17, Q20 and Q23 are equal to $I_{C18}/NM$, $I_{C21}/NM$ and $I_{C24}/NM$. Hence, the currents can be reduced and therefore the power consumption can be reduced.

The present invention is not limited to the specifically disclosed embodiments, and variations and modifications may be made without departing from the scope of the present invention.

What is claimed is:

1. A current supply circuit comprising:

a current source producing a first current;

current amplifying means for producing a second current having a magnitude $a \cdot I/h_{FE}$ from the first current where a is a constant, I is a magnitude of the first current and $h_{FE}$ is a current transfer ratio of current supply means; and said current supply means for producing a third current from said second current so that said third current has a magnitude equal to $a \cdot I$.

2. The current supply circuit as claimed in claim 1, wherein said current amplifying means comprises:

a first transistor which has a base coupled to the current source and produces a collector current dependent on a current flowing in the base of the first transistor;

a second transistor having a collector connected to the base of the first transistor, the second transistor controlling the current flowing in the base of the first transistor on the basis of a current flowing in a base of the second transistor; and a current-mirror circuit coupled to a collector of the first transistor, the base of the second transistor and the current supply means, the current-mirror circuit controlling the current flowing in the base of the second transistor and the first current supplied to said current supply means on the basis of the collector current of the first transistor.

3. The current supply circuit as claimed in claim 2, wherein said current-mirror circuit has a current ratio such that the first current supplied to said current supply means is greater than the current flowing in the base of the second transistor.

4. The current supply circuit as claimed in claim 2, wherein said current-mirror circuit comprises:

a third transistor having a base and a collector which are connected to the collector of the first transistor, and an emitter coupled to a first power supply line;

a fourth transistor having a base connected to the base of the third transistor, a collector connected to the base of the second transistor, and an emitter coupled to the first power supply line; and a fifth transistor having a base connected to the bases of the third and fourth transistors, a collector connected to the current supply means, and an emitter coupled to the first power supply line, the emitters of the first and second transistors being coupled to a second power supply line.

5. The current supply circuit as claimed in claim 3, wherein said current-mirror circuit comprises:

a third transistor having a base and a collector which are connected to the collector of the first transistor, and an emitter coupled to a first power supply line;

a fourth transistor having a base connected to the base of the third transistor, a collector connected to the base of the second transistor, and an emitter coupled to the first power supply line; and a fifth transistor having a base connected to the bases of the third and fourth transistors, a collector connected to the current supply means, and an emitter coupled to the first power supply line, the emitters of the first and second transistors being coupled to a second power supply line.

6. The current supply circuit as claimed in claim 4, further comprising:

a first resistance element which is connected between the emitter of the third transistor and the first power supply line and limits an emitter current of the third transistor;

a second resistance element which is coupled between the emitter of the fourth transistor and the first power supply line and limits an emitter current of the fourth transistor; and a third resistance element which is coupled between the emitter of the fifth transistor and the first power supply line and limits an emitter current of the fifth transistor, a ratio of the emitter currents of the third, fourth and fifth transistors being controlled by the first, second and third resistance elements.

7. The current supply circuit as claimed in claim 5, further comprising:

a first resistance element which is connected between the emitter of the third transistor and the first power supply line and limits an emitter current of the third transistor;

a second resistance element which is coupled between the emitter of the fourth transistor and the first power supply line and limits an emitter current of the fourth transistor; and a third resistance element which is coupled between the emitter of the fifth transistor and the first power supply line and limits an emitter current of the fifth transistor, a ratio of the emitter currents of the third, fourth and fifth transistors being controlled by the first, second and third resistance elements.

8. The current supply circuit as claimed in claim 4, wherein each of the third, fourth and fifth transistors of the current-mirror circuit has a plurality of collectors for controlling a ratio of collector currents of the third, fourth and fifth transistors.

9. The current supply circuit as claimed in claim 5, wherein each of the third, fourth and fifth transistors of the current-mirror circuit has a plurality of collectors for controlling a ratio of collector currents of the third, fourth and fifth transistors.

10. The current supply circuit as claimed in claim 6, wherein each of the third, fourth and fifth transistors of the current-mirror circuit has a plurality of collectors for controlling a ratio of collector currents of the third, fourth and fifth transistors.

11. The current supply circuit as claimed in claim 7, wherein each of the third, fourth and fifth transistors of the current-mirror circuit has a plurality of collectors for controlling a ratio of collector currents of the third, fourth and fifth transistors.

12. The current supply circuit as claimed in claim 6, further comprising a fourth resistance element connected between the collector of the third transistor and the collector of the first transistor, the fourth resistance element maintaining potentials of the bases of the third, fourth and fifth transistors at a predetermined level.

13. The current supply circuit as claimed in claim 7, further comprising a fourth resistance element connected between the collector of the third transistor and the collector of the first transistor, the fourth resistance element maintaining potentials of the bases of the third, fourth and fifth transistors at a predetermined level.

14. The current supply circuit as claimed in claim 1, further comprising a signal source for generating a signal applied to the current supply means together with the third current.

15. The current supply circuit as claimed in claim 1, wherein said current source comprises a current mirror circuit which outputs the first current.

16. The current supply circuit as claimed in claim 1, wherein said current source comprises a resistance element connected to a power supply line and the base of the first transistor.

17. A current supply circuit comprising:

a current source producing a first current;

a current amplifying circuit which produces a second current having a magnitude $a \cdot I/h_{FE}$ from the first current where a is constant, I is a magnitude of the first current and $h_{FE}$ is a current transfer ratio of a current supply means; and the current supply circuit which produces a third current from said second current, the third current having a magnitude equal to $a \cdot I$.

* * * * *

UNITED STATES PATENT AND TRADEMARK OFFICE

CERTIFICATE OF CORRECTION

PATENT NO. : 5,640,110
DATED : June 17, 1997
INVENTOR(S) : NIRATSUKA et al.

It is certified that error appears in the above-indentified patent and that said Letters Patent is hereby corrected as shown below:

On the title page:

Please delete item [76] and insert therefor --[75]--.

Please insert --[73] Assignee: Fujitsu Limited, Kawasaki-shi, Japan --.

Signed and Sealed this

Fourteenth Day of October, 1997

*Attest:*

BRUCE LEHMAN

*Attesting Officer* *Commissioner of Patents and Trademarks*